United States Patent [19]

Damond et al.

[11] Patent Number: 5,363,400
[45] Date of Patent: Nov. 8, 1994

[54] METHOD OF TREATING METALS BY DEPOSITION OF MATERIALS AND FURNACE FOR IMPLEMENTING SAID METHOD

[75] Inventors: Eric Damond, Caluire; Georges Dervieux, St Priest; Patrick Jacquot, Chassieu, all of France

[73] Assignee: Innovatique S.A., France

[21] Appl. No.: 130,489

[22] Filed: Oct. 1, 1993

Related U.S. Application Data

[62] Division of Ser. No. 802,984, Dec. 6, 1991, Pat. No. 5,278,861.

[30] Foreign Application Priority Data

Dec. 6, 1990 [FR] France .................................. 90 15331

[51] Int. Cl.$^5$ .............................................. C23C 14/32
[52] U.S. Cl. ...................................... 373/10; 313/566; 204/298.04; 204/298.41
[58] Field of Search .................. 373/10; 118/723 VE, 118/726, 723 CB, 723 E; 204/298.09, 298.04, 298.4, 192.11, 192.38, 298.16, 298.17, 298.41, 298.12, 298.01; 219/121.47, 121.15; 313/566

[56] References Cited

U.S. PATENT DOCUMENTS

| | | | |
|---|---|---|---|
| 3,748,253 | 7/1973 | Provenzano | 204/298.09 |
| 4,009,090 | 2/1977 | Veigel | 204/298.09 |
| 4,197,175 | 4/1980 | Moll et al. | 204/298.09 |
| 4,290,875 | 9/1981 | Duckworth | 204/298.09 |
| 4,448,652 | 5/1984 | Pachonik | 204/298.09 |
| 4,747,927 | 5/1988 | Rille et al. | 204/298.09 |
| 4,885,075 | 12/1989 | Hillmann | 204/298.09 |
| 5,021,139 | 6/1991 | Hartig et al. | 204/298.09 |
| 5,180,478 | 1/1993 | Hughes | 204/298.09 |

*Primary Examiner*—Bruce A. Reynolds
*Assistant Examiner*—John A. Jeffery
*Attorney, Agent, or Firm*—William A. Drucker

[57] ABSTRACT

In a physical vapor deposition method of thermochemical treatment of metals, the substance of a target which constitutes a first electrode of a treatment furnace is evaporated by ion bombardment optionally assisted by an electrical arc discharge. The particles evaporated in this manner are deposited onto a substrate at the potential of a second electrode which is different from that of the first electrode. The substrate is heated during this deposition to a treatment temperature exceeding 600° C. and preferably between 800° C. and 1 200° C. The target and its ancillary members in the furnace are continuously cooled by a flow of cooling fluid so that when the treatment temperature is reached the material of the target remains solid and the evaporation occurring at the surface of the target is effected by sublimation. The result is to improve the regularity of the deposit, its adherence to the substrate and the treatment time.

13 Claims, 4 Drawing Sheets

METHOD OF TREATING METALS BY DEPOSITION OF MATERIALS AND FURNACE FOR IMPLEMENTING SAID METHOD

This is a divisional of copending application Ser. No. 07/802,984 filed on Dec. 6, 1991, now U.S. Pat. No. 5,278,861.

BACKGROUND OF THE INVENTION

1. Field of the Invention

The present invention concerns a method for the thermochemical treatment of metals by deposition of materials onto a substrate to be treated.

It is more particularly concerned with a physical vapor deposition (PVD) method in which the substance of a target which constitutes a first electrode of an ion bombardment treatment furnace is evaporated and the particles produced in this way are deposited onto a substrate constituting a second electrode at a potential different than that of the first electrode.

Of course, during this process the substrate is heated to the treatment temperature by the heat generated by the ion bombardment or by heating means provided inside the furnace, or even by a combination of these two means.

2. Description of the Prior Art

Until now the treatment temperature has been held below a particular threshold in the order of 500° C. to avoid exceeding the tempering temperature of the quenched steel and so to prevent deterioration of the mechanical properties of the parts treated (hardness, tensile strength, etc) such as are observed in practise when this temperature is exceeded. Also, it has been necessary to eliminate the risk of deformation of the treated parts and to remain within the temperature range allowed for the target and for the means used to monitor its evaporation.

This temperature limit was essential when using a magnetron to generate a magnetic field at the surface of the target to enhance evaporation without melting the target.

It is clear that in this case the treatment temperature produced inside the furnace must be as far away as possible from the melting point of the target and that this temperature is not high enough to damage the electromagnet circuit of the magnetron.

Furthermore, increasing the temperature above said threshold went counter to an advantage resulting from the use of a magnetron whereby heating of the substrate as a result of its bombardment with high-energy electrons from the target is reduced.

A particular object of the invention is to improve the quality of the thermochemical treatment previously described, in particular with reference to the regularity of the deposit (thickness, roughness), its adherence to the substrate and the treatment time. Another object is to master the treatment of depositing metal halogenides which were previously difficult to use or entailed the use of highly toxic elements. It is further directed to expanding the range of deposition treatments, in particular by enabling deposition of interdiffused multilayers or binary or ternary alloys and deposition followed by quenching.

SUMMARY OF THE INVENTION

To achieve these results the invention proposes to go against received wisdom as previously explained and to deposit the materials at a treatment temperature in a range between 800° C. and 1 200° C.

To achieve this result it proposes to use a vapor generator specially designed so that the target and its ancillary members inside the furnace are cooled at all times by a flow of cooling fluid so that when the parts to be treated are heated to the treatment temperature the material of the target remains solid and evaporation occurs at the surface of the target by sublimation.

The invention is naturally concerned also with a treatment furnace for implementing the method previously defined, this furnace comprising one or more cooled target vapor generators installed in a vacuum furnace with or without plasma assistance.

Because the target remains in the solid state at all times, it can be disposed vertically or horizontally at the most appropriate location. In practise the vapor generator(s) must be located so that the flows of metal vapor produced by the various evaporators are multidirectional and produce as homogeneous as possible a distribution of the deposit.

Embodiments of the invention will be described hereinafter by way of non-limiting example with reference to the appended drawings.

DETAILED DESCRIPTION OF THE INVENTION

Figure 1:
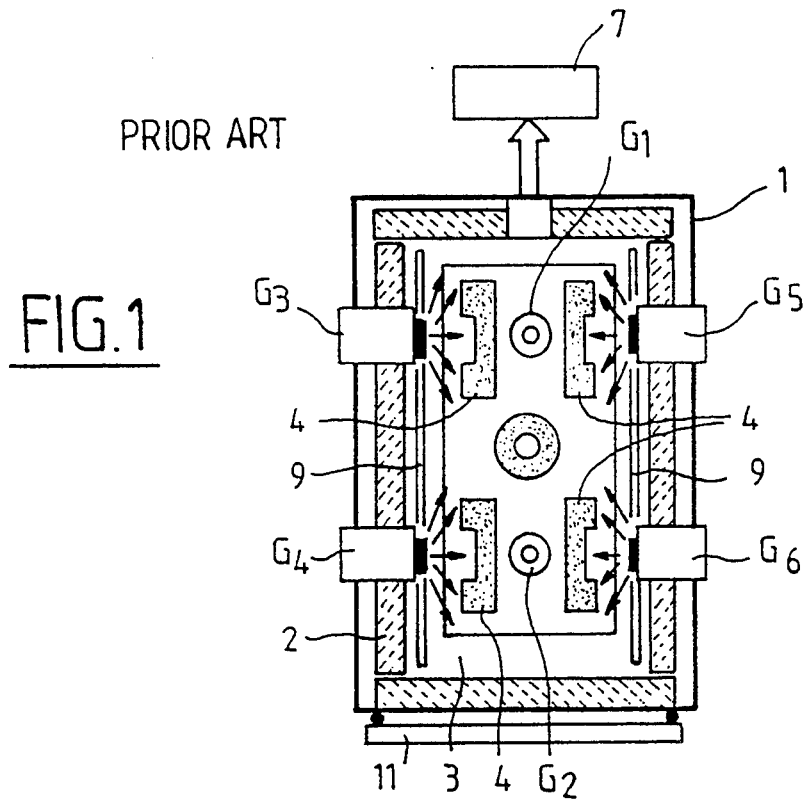
FIGS. 1 and 2 are diagrammatic views in horizontal cross-section (FIG. 1) and in vertical cross-section (FIG. 2) of a heat treatment furnace fitted with four vapor generators.
Figure 2:
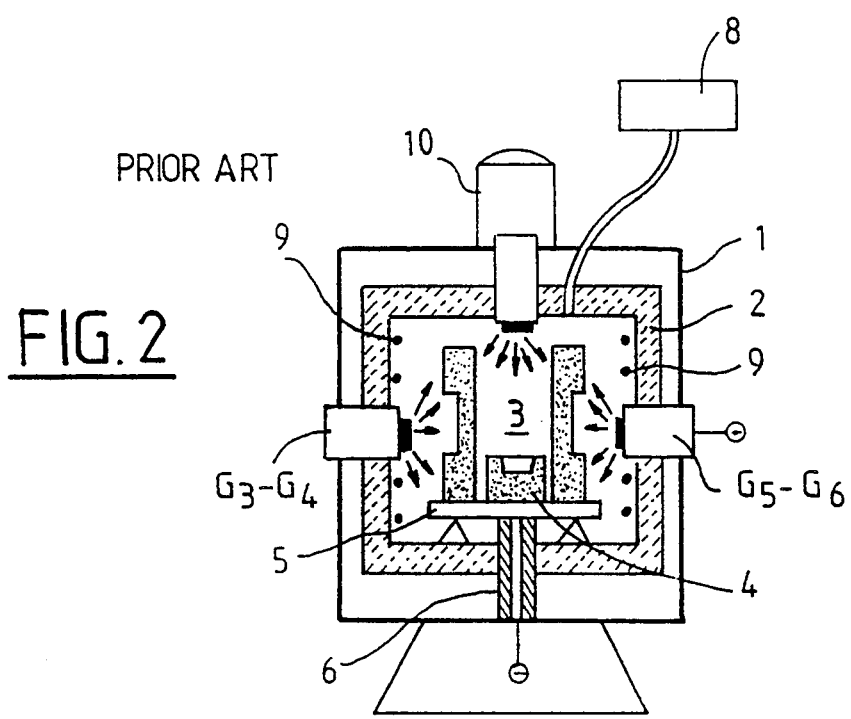

The furnace shown in FIGS. 1 and 2 is a conventional heat treatment furnace for ion bombardment in vacuum.

It comprises a sealed enclosure 1 with a single or double metal walls possibly in the latter case cooled by circulation of water in the space between the two walls.

Inside the enclosure 1 is a casing 2 made from a thermally insulative material which delimits the "laboratory" 3 of the furnace.

Within this laboratory 3 the parts 4 to be treated are placed on an electrically conductive material support 5 to which a bias voltage (for example, a pulsed DC voltage of a few hundred volts) may be applied by means of a current lead-through 6 which is sealed into an opening in the enclosure and which is electrically insulated from the enclosure.

As in all vacuum heat treatment furnaces, the interior volume of the enclosure 1 communicates with an external pumping station 7 for producing a relative vacuum ($8 \times 10^{-3}$ mbar to $10^{-1}$ mbar, for example) and a source 8 of neutral or reactive gas.

The parts are heated to the treatment temperature, which is between 400° C. and 1 300° C. in this example, by resistive heating elements 9 made from graphite, for example, carried by the inside walls of the casing 2. They are cooled by circulation of gas injected into the furnace at the end of the treatment. The gas is circulated in the furnace, possibly through a heat exchanger, by a turbine 10. This circuit is advantageously designed to enable pressurized gas quenching.

In this example the furnace is fitted with six vapor generators $G_1$ through $G_6$, namely:
- two horizontal target generators $G_1$, $G_2$ mounted on the top surface of the enclosure 1, and
- four vertical target generators $G_3$, $G_4$, $G_5$, $G_6$ mounted on two opposite vertical walls of the enclosure 1.

Of course, each of the generators passes through the enclosure 1 and the casing so that the target is in the laboratory near the parts 4 to be treated.

Access to the interior of the furnace is provided by a sealed and thermally insulative front door 11 which also constitutes the door of the casing 2.

As previously mentioned, the vapor generators $G_1$ through $G_6$, and in particular the vertical target generators, must be designed to create the vapor phase by direct sublimation of the metal constituting the target.

To this end, these generators may be designed to implement an electrical arc evaporation process which produces a metal vapor by means of electrical arcs moving over the surface of the target and optionally combines the metal vapor with a given reactive gas to synthesize a metal, an alloy or a nitride, carbide or oxide type compound in the form of a thin layer on the substrate.

Figure 3:
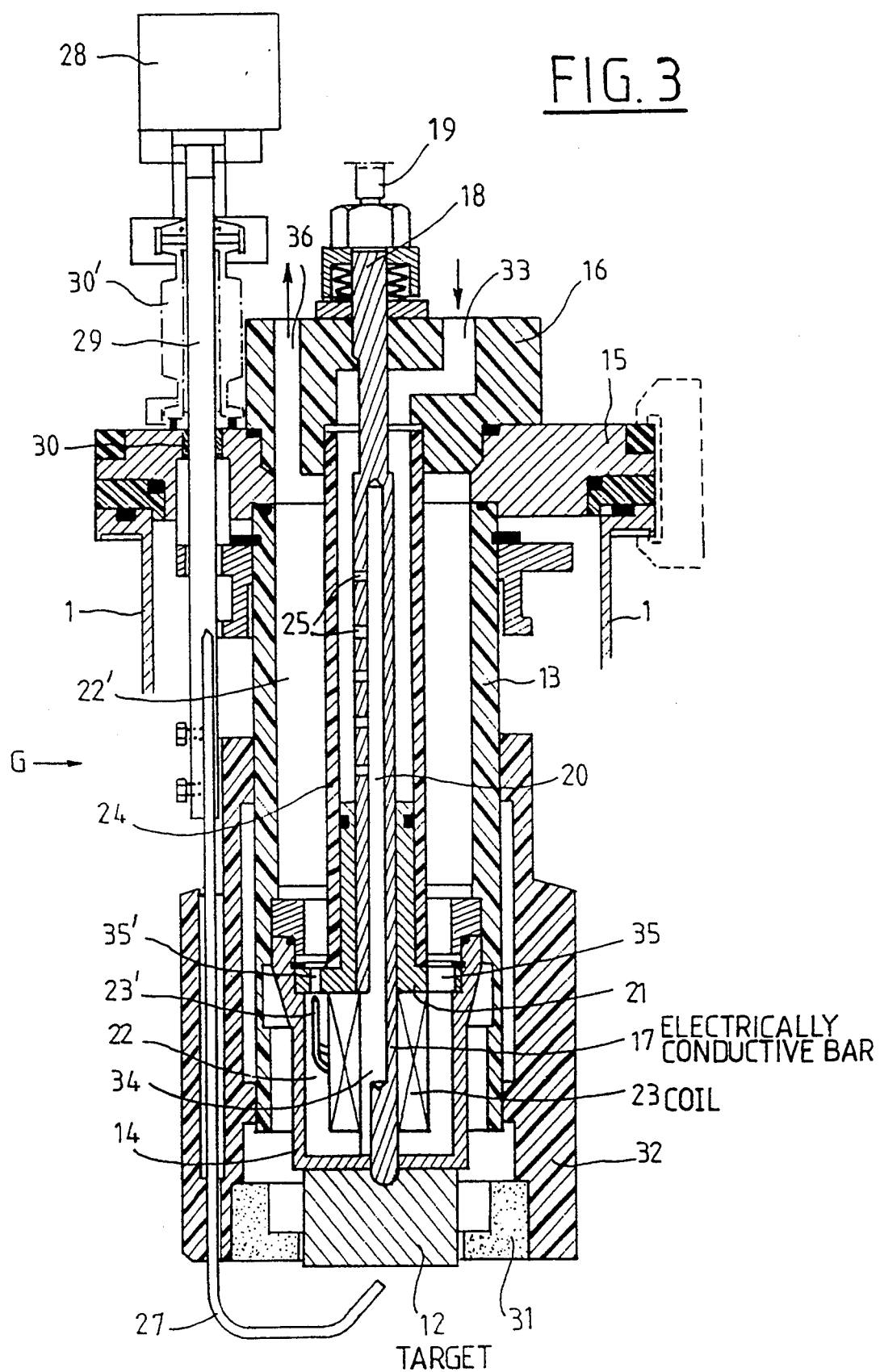
FIG. 3 is a view in axial cross-section and to a larger scale of a vapor generator that can be used to implement the method in accordance with the invention.
Figure 4:
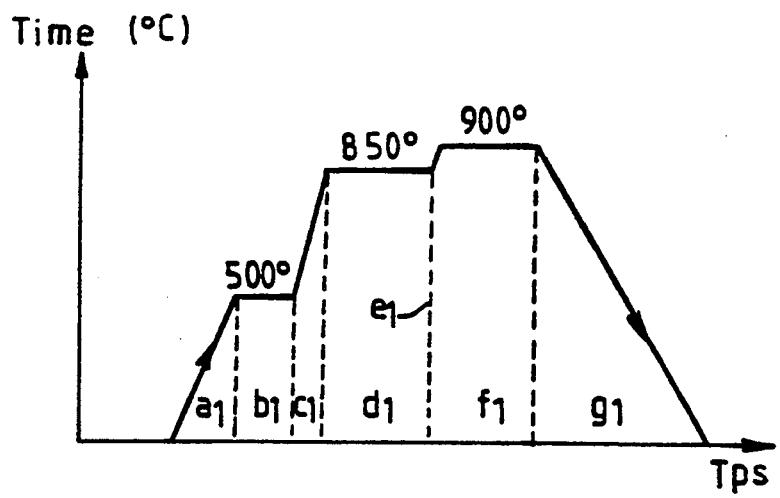
FIGS. 4 through 10 are diagrams plotting temperature as a function of time showing different types of treatment by the method in accordance with the invention.
Figure 5:
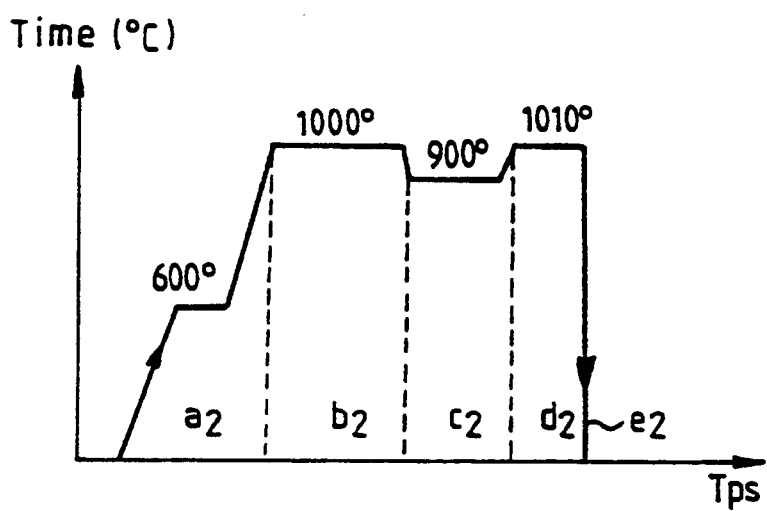
Figure 6:
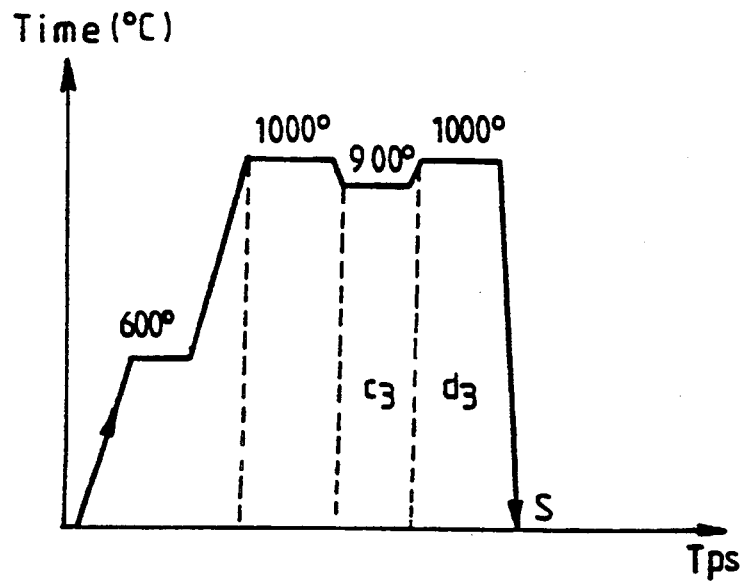
Figure 7:
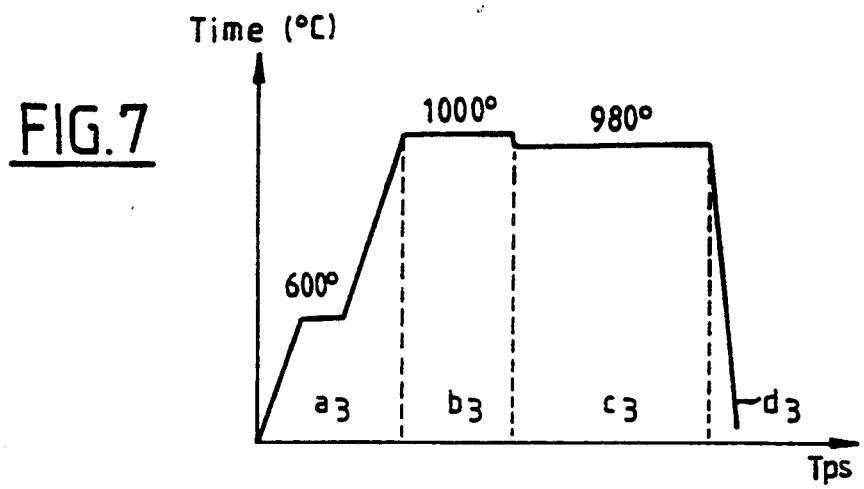
Figure 8:
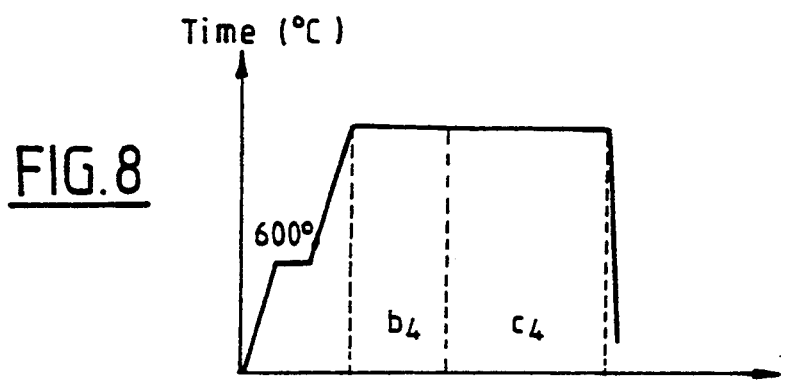
Figure 9:
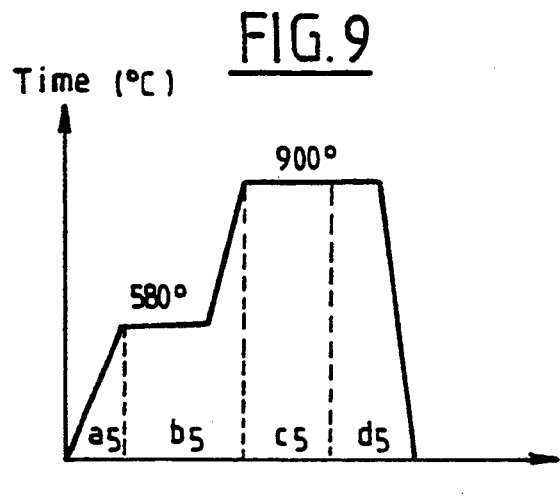

As shown in FIG. 3, a generator G may comprise:
- a cylindrical target 12 made from the material to be evaporated and to be deposited onto the parts 4 to be treated (it must be understood that the targets used in the same furnace may be of different kinds so as to produce deposits incorporating more than one element, for example more than one metal);
- a support structure comprising a tubular sleeve 13 closed at one end 14 carrying the target 12 coaxially and provided at its other end with a flange 15 inserted, fixed and sealed into an orifice in the enclosure 1 of the furnace from which it is electrically insulated;
- a block 16 of electrically insulative material which closes the tubular sleeve 13 at the flange 15 and through which passes an electrically conductive bar 17 which extends coaxially inside the sleeve 13 into electrical contact with the target 12, the bar 17 having an outer end 18 passing through the block 16 provided with means 19 for connecting it to an electrical circuit; the bar has a coaxial passage 20 at the end near the target 12;
- a shouldered bush 21 which divides the volume between the tubular sleeve 13 and the bar 17 into two chambers 22, 22';
- an electromagnet coil 23 disposed around the bar 17 in the chamber 22 adjacent the target 12 for creating a magnetic field near the target 12;
- an insulative tube 24 which extends into the chamber 22' coaxially with the bar 17 between the block 16 and the bush 21, this tube delimiting with the bar 17 an intermediate volume which communicates with the passage 20 through orifices 25 formed in the bar 17;
- an arc discharge initiator device comprising an exciter electrode 27 made from a refractory metal or alloy such as molybdenum, for example, parallel to the axis of the tubular sleeve 13, outside the latter, the electrode 27 having a curved end facing towards the target 12;
- a mechanism for actuating the exciter electrode 27 comprising a drive element (actuator 28) located outside the furnace and an actuator rod 29 to which the electrode 27 is fixed, the rod 29 being slidably or even rotatably mounted in sealed bearings 30 passing through the flange 15 (the seal being provided by sealing bellows 30');
- a floating potential screen 31 made from graphite, for example, in the form of a ring sliding on the target 12 and carried by a tubular support sleeve 32 coaxial with the tubular sleeve 13 and able to slide thereon; and
- a cooling fluid circuit having an inlet pipe connected to an inlet passage 33 in the block 16 and discharging into the intermediate volume between the bar 17 and the insulative tube 24, an axial slot 34 milled into the bar 17 and providing communication between the axial passage 20 and the chamber 22, holes 35 in the bush 21 to provide communication between the chambers 22 and 22', and a return pipe connected to a return passage 36 in the block 16.

The vapor generator previously described operates in the following manner:

A low-voltage (less than 100 V) high direct current (10 to 400 A) supplied by an electrical power source of the kind used in electrical arc welding is applied to the bar 17 and therefore to the target 12.

The electrode 27 causes an electrical arc discharge which is localized on the surface of the target 12 by virtue of the floating potential on the screen 31.

At the same time the coil 23 is energized (by conductors 23' passing through holes 35') to apply a magnetic field to the target 12.

This magnetic field confines the plasma and controls movement of the arc discharge over the target 12.

The target constitutes a cathode of a plasma generator in which the enclosure 1 of the furnace or even the resistive heating elements 9 constitute the anode.

The parts 4 to be treated are negatively biased during deposition by a pulsed DC voltage of few hundred volts.

By virtue of the arrangements previously described, the entire generator (and in particular the target 12 and the electromagnet coil 23) is cooled by the circulation of cooling fluid. As a result the temperature at the surface of the target can be very high, even approaching the melting point of the target material, while the remainder of the generator is kept at a relatively low temperature.

A three-fold process therefore occurs at the target:
- abnormal luminescent electrical discharge generating a plasma on the target 12 because of the cathode potential and the electric field;
- arc discharge caused by the electrode 27;
- application of a magnetic field to the target 12 so that the intensity of ion bombardment can be increased and concentric and high-speed movement of the arc spots can be obtained.

By reason of these three effects the surface of the target 12 is intensely heated and material is released from it by sublimation as a result of the impact of the ions of the ionized gas and of the arc discharge.

The material released from the target 12 is transferred into the neutral or reactive atmosphere of the furnace primarily by an ionized gas phase transport mechanism, the effect of the electric field established between the generator and the parts to be treated depending on the distance between them, with the possibility of giving preference to the laterally disposed generators $G_3$ through $G_6$.

By virtue of the potential difference between the parts 4 to be treated and the anode there occurs at the parts 4 to be treated a second abnormal luminescent electrical discharge which improves the restructuring of the deposit of material and its adherence (by virtue of phenomena of diffusion or of interdiffusion at the substrate/deposit interface and condensation phenomena assisted by the ion bombardment).

It is found that these phenomena are significantly accentuated in the temperature range of the method in accordance with the invention and in particular between 800° C. and 1 300° C.

It is naturally preferable to apply to the parts 4 a surface treatment before and/or after the deposition phase, in particular to obtain a substrate/deposit bond exhibiting a gradual change of hardness, to limit mechanical stresses in the interface area and to achieve excellent substrate/deposit adherence.

Various alternative pre-treatment and post-treatment processes are available:

a) Carbon enrichment of the surface of steel parts up to a concentration in the order of 0.8%. This is a carburizing treatment with optional plasma assistance.

b) Production of a surface layer over-enriched with carbon to form fine and spheroidal carbides, with a surface carbon concentration between 0.8% and 2%. This is a over-carburizing treatment usually applied to steels containing carbide-producing alloying elements (Cr, Mo, W, V, Nb, etc). Like treatment a) this treatment can be followed in the same cycle by high-temperature deposition and pressurized gas martensitic quenching to harden the carburized sub-layer.

c) Ion nitriding titanium alloy at high temperature followed by deposition of titanium nitride, for example.

d) It may be advantageous to carry out a high-temperature diffusion heat treatment after high-temperature deposition in order to achieve interdiffusion between the elements of the substrate and those of the coating.

FIGS. 4 through 9 illustrate examples of treatment by the method in accordance with the invention.

EXAMPLE 1

(FIG. 4)

This example concerns a hybrid treatment cycle combining ion nitriding with high-temperature deposition of titanium nitride and comprising the following phases:

a first phase $a_1$ of heating in vacuum to 500° C.,
a homogenization phase $b_1$ at 500° C.,
a second heating phase $c_1$ from 500° C. to 850° C.,
an ion nitriding phase $d_1$ at 850° C.,
a heating phase $e_1$ from 850° C. to 900° C.,
a titanium nitride deposition phase $f_1$ at 900° C.,
a cooling phase $g_1$.

EXAMPLE 2

(FIG. 5)

This example concerns a hybrid treatment comprising ion or low-pressure over-carburizing followed by high-temperature deposition of chromium nitride, for example with austenitization and pressurized gas martensitic quenching. This treatment, which is suitable for Z 38 CDV 5 heat treatment steels (for example, a steel for hot forging dies), comprises the following phases:

a first phase $a_2$ of heating in vacuum to 600° C., a period at this temperature and then further heating to 1 000° C.,
a second phase $b_2$ of over-carburization at 1 000° C.,
a deposition phase $c_2$ at 900° C. (deposition of chromium nitride, for example),
an austenitization phase $d_2$ at 1 010° C.,
a pressurized gas quench phase $e_2$.

EXAMPLE 3

(FIG. 6)

This example concerns a hybrid treatment combining ion over-carburization with high-temperature deposition of boron followed by a diffusion phase. This treatment is similar to that previously described except that during the phase $c_3$ at 900° C. boron is deposited and the next phase $d_3$ at 1 000° C. is a diffusion phase in which boron carbide is formed by migration of carbon to the boron.

EXAMPLE 4

(FIG. 7)

This example concerns a hybrid treatment combining high-temperature deposition of chromium followed by a vacuum diffusion phase. It comprises:

a phase $a_3$ of heating in vacuum to 1 000° C. with a constant-temperature period at 600° C.,
a constant-temperature phase $b_3$ at 1 000° C. in which the chromium is deposited,
a vacuum diffusion phase $c_3$ at 980° C.,
a pressurized gas quench phase $d_3$.

This treatment produces a layer of high-hardness ($\simeq$2 000 HV) $Cr_{23} C_6$ and $Cr_7 C_3$ type chromium carbides.

EXAMPLE 5

(FIG. 8)

This example concerns a hybrid treatment for depositing boron similar to the previous treatment except that the boron deposition phase $b_4$ and the vacuum diffusion phase $c_4$ are carried out at a temperature in the order of 900° C.

This treatment produces high-hardness (2 000 HV) FeB and $Fe_2B$ type iron borides.

EXAMPLE 6

(FIG. 9)

This example concerns a hybrid treatment combining ion nitriding with subsequent deposition of diffused chromium. This treatment comprises:

a phase $a_5$ of heating in vacuum to 580° C.,
a phase $b_5$ of ion nitriding at 580° C. followed by heating to 900° C.,
a chromium deposition phase $c_5$ at 900° C.,
a diffusion phase $d_5$ at 900° C. and,
pressurized gas quenching.

This treatment produces a chromium layer of very high hardness.

EXAMPLE 7

(FIG. 10)

This example concerns a carburizing or over-carburizing treatment for carbon tool steel at high temperature by evaporating or sublimating a graphite target, possibly with a subsequent diffusion phase and pressurized gas quenching.

Figure 10:
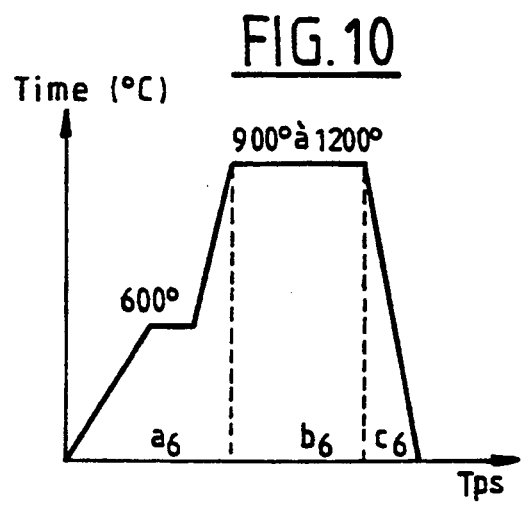

As shown in FIG. 10, this treatment comprises:

a phase $a_6$ of heating in vacuum to a temperature of 900° C. to 1 200° C., according to the nature of the steel, an evaporation or sublimation phase $b_6$ with simultaneous diffusion of carbon to carburize the steel (with no hydrocarbon gas vector), a pressurized gas quenching phase $c_6$.

Of course, the invention is not limited to these examples and many other deposits can be obtained.

To this end the materials constituting the target to be evaporated may indifferently comprise:

a pure metal such as titanium, hafnium, chromium, nickel, boron or tungsten, for example, solid carbon (high-density graphite, vitreous or pyrolytic carbon), a binary alloy (Ti-Al, Cr-Al, Cr-Ni, Cr-Ti, Fe-Si, etc, for example), a multi-element complex alloy (MCrAlY, NiCoCrAlYTa, Ti-Hf-Al, etc).

Likewise, during the deposition phase a neutral gas such as argon, helium, hydrogen or another gas may be introduced into the furnace to stabilize the arc discharge, to promote ionization or to achieve a precise working pressure. A reactive gas may be injected during deposition to combine with the metal vapor and form a metal nitride, oxide or carbide type compound, or a combination of these gases may be injected to obtain hybrid carbo-nitride, oxi-nitride, etc compounds.

There is claimed:

1. Physical vapor deposition method of thermochemical treatment of metals in which the substance of a target which constitutes a first electrode of a treatment furnace is evaporated by ion bombardment optionally assisted by an electrical arc discharge and the particles evaporated in this manner are deposited onto a substrate at the potential of a second electrode which is different from that of the first electrode, the substrate being heated during this deposition to a treatment temperature exceeding 600° C. and preferably between 800° C. and 1 200° C., and said target and its ancillary members in the furnace are continuously cooled by a flow of cooling fluid so that when the treatment temperature is reached the material of the target remains solid and the evaporation occurring at the surface of the target is effected by sublimation.

2. Method according to claim 1 wherein the material of the target is a pure metal such as titanium, hafnium, chromium, nickel, boron or tungsten.

3. Method according to claim 1 wherein the material of the target is carbon such as high-density graphite or vitreous or pyrolytic carbon.

4. Method according to claim 1 wherein the material of the target is a binary alloy such as Ti-Al, Cr-Al, Cr-Ni, Cr-Ti or Fe-Si.

5. Method according to claim 1 wherein a neutral gas is introduced into the furnace during the deposition phase.

6. Method according to claim 1 wherein a reactive gas is introduced into the furnace during the deposition phase.

7. Method according to claim 1 in which a surface treatment phase precedes the deposition phase.

8. Method according to claim 7 wherein the surface treatment produces carbon enrichment of the substrate surface.

9. Method according to claim 8 wherein said enrichment is obtained by a carburizing treatment with optional plasma assistance.

10. Method according to claim 7, wherein the surface treatment produces a surface layer having a carbon concentration between 0.8% and 2%.

11. Method according to claim 7 wherein the surface treatment is ion nitriding.

12. Method according to claim 1 comprising high-temperature diffusion heat treatment after the deposition phase.

13. Method according to claim 1 comprising a pressurized gas quench phase.

* * * * *